United States Patent
Lee

(10) Patent No.: US 7,745,348 B2
(45) Date of Patent: Jun. 29, 2010

(54) MANUFACTURING METHOD OF A SEMICONDUCTOR DEVICE

(75) Inventor: Han-Choon Lee, Seoul (KR)

(73) Assignee: Dongbu Electronics Co., Ltd., Seoul (KR)

(*) Notice: Subject to any disclaimer, the term of this patent is extended or adjusted under 35 U.S.C. 154(b) by 285 days.

(21) Appl. No.: 11/228,419

(22) Filed: Sep. 15, 2005

(65) Prior Publication Data

US 2006/0063395 A1 Mar. 23, 2006

(30) Foreign Application Priority Data

Sep. 17, 2004 (KR) .................. 10-2004-0074498

(51) Int. Cl.
*H01L 21/31* (2006.01)
*H01L 21/469* (2006.01)

(52) U.S. Cl. .................. 438/785; 257/E21.168

(58) Field of Classification Search .............. 438/785; 257/E21.168
See application file for complete search history.

(56) References Cited

U.S. PATENT DOCUMENTS

| | | | |
|---|---|---|---|
| 6,376,371 B1* | 4/2002 | Jain et al. | 438/681 |
| 6,428,859 B1* | 8/2002 | Chiang et al. | 427/457 |
| 6,518,191 B2* | 2/2003 | Nakagawa | 438/710 |
| 6,951,816 B2* | 10/2005 | Nopper et al. | 438/678 |
| 7,186,446 B2* | 3/2007 | Kim et al. | 427/569 |
| 7,211,507 B2* | 5/2007 | Dunn et al | 438/627 |
| 7,241,686 B2* | 7/2007 | Marcadal et al. | 438/656 |
| 2001/0046780 A1* | 11/2001 | Nakagawa | 438/712 |
| 2003/0017697 A1* | 1/2003 | Choi et al. | 438/679 |
| 2003/0079686 A1* | 5/2003 | Chen et al. | 118/715 |
| 2003/0219979 A1* | 11/2003 | Choi et al. | 438/685 |
| 2004/0009307 A1* | 1/2004 | Koh et al. | 427/569 |
| 2004/0036129 A1* | 2/2004 | Forbes et al. | 257/407 |
| 2004/0145062 A1* | 7/2004 | Nopper et al. | 257/774 |
| 2004/0192021 A1* | 9/2004 | Li | 438/622 |
| 2004/0198046 A1* | 10/2004 | Yu-Chou et al. | 438/689 |
| 2004/0219784 A1* | 11/2004 | Kang et al. | 438/653 |
| 2004/0224506 A1* | 11/2004 | Choi et al. | 438/681 |
| 2004/0256351 A1* | 12/2004 | Chung et al. | 216/13 |
| 2005/0106865 A1* | 5/2005 | Chung et al. | 438/685 |
| 2005/0124154 A1* | 6/2005 | Park et al. | 438/643 |
| 2006/0019494 A1* | 1/2006 | Cao et al. | 438/680 |
| 2006/0240187 A1* | 10/2006 | Weidman | 427/248.1 |
| 2006/0251812 A1* | 11/2006 | Kang et al. | 427/248.1 |
| 2007/0054047 A1* | 3/2007 | Ishizaka et al. | 427/248.1 |

* cited by examiner

*Primary Examiner*—Kiesha R Bryant
*Assistant Examiner*—Igwe U Anya
(74) *Attorney, Agent, or Firm*—The Law Offices of Andrew D. Fortney; Andrew D. Fortney

(57) ABSTRACT

A method of manufacturing a semiconductor device employs a PEALD method including using an organometallic Ta precursor to form a TaN thin film. As a result, a conformal TaN diffusion barrier may be formed at a temperature of 250° C. or higher, so that impurities are reduced and density is increased in the TaN thin film.

18 Claims, 8 Drawing Sheets

US 7,745,348 B2

MANUFACTURING METHOD OF A SEMICONDUCTOR DEVICE

CROSS-REFERENCE TO RELATED APPLICATION

This application claims priority to and the benefit of Korean Patent Application No. 10-2004-0074498 filed in the Korean Intellectual Property Office on Sep. 17, 2004, the entire contents of which are incorporated herein by reference.

BACKGROUND OF THE INVENTION a) Field of the Invention

The present invention relates to a manufacturing method of a semiconductor device.

b) Description of the Related Art

During a manufacturing process of a semiconductor device, a diffusion barrier is frequently formed on an interior wall of a hole such as a contact hole or via hole, in order to prevent a metal such as copper used for a metal line from diffusing into underlying silicon and/or an adjacent oxide. The diffusion barrier must have conductivity, and typical examples thereof are titanium nitride (TiN), tungsten nitride (WN), and tantalum nitride (TaN).

Recently, copper has frequently been used for metal lines in semiconductor devices instead of aluminum, in order to improve device characteristics, such as operating speed or resistance. This copper has merits such as low resistivity and high melting point, but it also has drawbacks as described below.

For example, copper has no fine protective layer such as $Al_2O_3$, it shows poor adhesion to silicon dioxide ($SiO_2$), and it is difficult to dry etch. In addition, copper has a diffusion coefficient about 106 times higher than that of aluminum in silicon, and the diffused copper forms a deep energy level between band gaps. In addition, copper also has a high diffusion coefficient in $SiO_2$, and accordingly, an insulating property between the copper lines may deteriorate. As a result, the high diffusion coefficient of Cu in silicon or $SiO_2$ may substantially deteriorate reliability of a semiconductor device.

Therefore, in order to ensure sufficient reliability during a copper line process, there is a need for a diffusion barrier that can prevent copper from rapidly diffusing into silicon or $SiO_2$.

As above-described, the diffusion barrier plays an important role in interconnections. Therefore, it is important to develop a technique that is capable of forming a fine diffusion barrier. TaN, for example, is thermodynamically stable with copper. Accordingly, many methods have been developed to use a TaN thin film as a fine diffusion barrier during the copper line manufacturing process.

TaN thin films generally have high thermal stability, excellent adhesion to the oxide layer, and a desirable diffusion barrier characteristic. Accordingly, TaN thin films are widely used as a diffusion barrier. Generally, the TaN thin film is formed of a TaN/Ta bi-layer with a thickness of 100 nm or more by a physical vapor deposition (PVD) method.

As semiconductor devices have become smaller, Cu lines with a width of 65 nm or less are desired. Accordingly, the TaN thin film must have a thickness of less than 5 nm. However, according to the PVD method, the TaN thin film generally cannot realize sufficiently uniform step coverage at such thicknesses. In order to overcome this non-uniform deposition and to acquire excellent step coverage and a desirable diffusion barrier characteristic, an atomic layer deposition (ALD) method has been developed.

The ALD method employs a precursor (for example, a metal-organic precursor and a halogen compound such as $TaCl_5$) to form or deposit a TaN thin film. However, when the TaN thin film is deposited by the ALD method employing the metal-organic precursor, the TaN thin film may include a substantial amount of carbon. In this case, a low film density and high resistivity result, such that the copper lines may not have desired electric characteristics.

Therefore, research has been undertaken to employ the halogen compound such as $TaCl_5$ as a precursor for the diffusion barrier. However, in this case, impurities such as Cl may cause corrosion to the copper lines such that reliability of the semiconductor device may deteriorate.

The above information disclosed in this Background section is only for enhancement of understanding of the background of the invention, and therefore, it may contain information that does not form information or prior art that may be known in this or any other country to a person of ordinary skill in the art.

SUMMARY OF THE INVENTION

The present invention has been made in an effort to provide a manufacturing method of a semiconductor device having advantages of reducing impurities and increasing density of a TaN thin film.

An exemplary method of manufacturing a semiconductor device according to an embodiment of the present invention includes forming a substrate having a plurality of predetermined structures therein, and forming a TaN thin film on the substrate by plasma-enhanced atomic layer deposition (PEALD) using a plasma gas comprising a Ta precursor and a hydrogen source gas (e.g., $H_2$). The substrate generally contains a plurality of semiconductor devices (e.g., transistors, diodes, resistors, capacitors, etc.) therein and/or thereon.

Another exemplary method of manufacturing a semiconductor device according to an embodiment of the present invention includes purging a reactor and a gas line, injecting a Ta precursor in the reactor to deposit a Ta-containing layer on a substrate, purging the reactor and the gas line again, supplying a hydrogen source gas (e.g., $H_2$ gas) by opening a hydrogen source gas valve connected to the reactor and gas line, forming a TaN thin film by supplying a plasma power to the reactor, and stopping the supply of the plasma power and the hydrogen source gas.

The Ta precursor may be selected from among pentakis(ethylmethylamino)tantalum (PEMAT), tertbutylimido(tris-diethylamide)-tantalum (TBTDET), pentakis(diethylamide)tantalum (PDEAT), and pentakis(dimethylamide)tantalum (PDMAT).

The first and second purging steps of the reactor and gas line may be respectively performed for 1 to 3 sec, and/or the plasma power may be supplied for a length of time of from 11 to 13 sec.

An inert and/or nitrogen-containing gas (e.g., $N_2$ gas) may be further supplied to the reactor, and the plasma gas may therefore further comprise an inert and/or nitrogen-containing gas.

The TaN film may be deposited at a temperature of 250° C. or higher.

The manufacturing method may further include forming a metal line on the TaN thin film. The metal line may comprise copper, aluminum, and/or tungsten.

The manufacturing method may further include depositing a seed copper layer on the TaN thin film and forming a copper line on the seed copper layer. The seed copper layer may be formed by PVD, ALD, or a CVD method. Also, the manufacturing method may further include depositing Ta on the TaN thin film, before depositing a seed copper layer on the Ta and/or forming a copper line on the seed copper layer.

The manufacturing method may further include forming a copper line on the TaN thin film in a dual damascene or single damascene pattern.

DETAILED DESCRIPTION OF THE EMBODIMENTS

Figure 1:
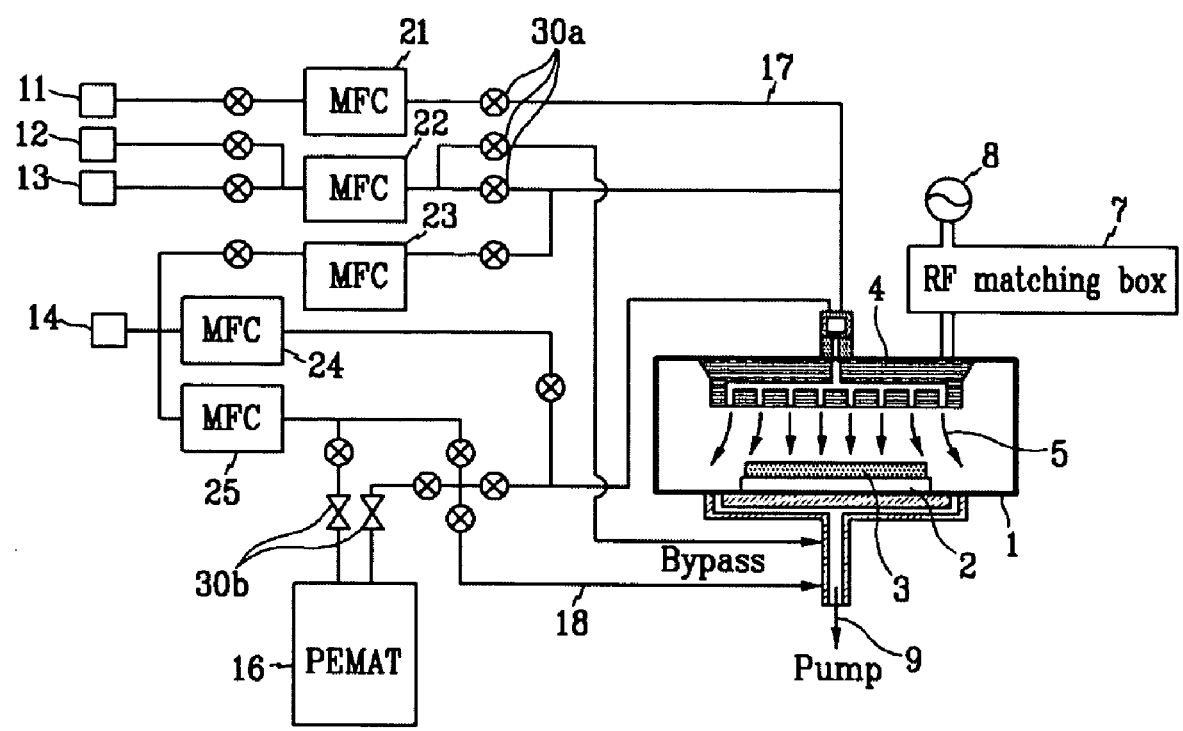
FIG. 1 is a schematic diagram of an apparatus used in a manufacturing method of a semiconductor device according to an exemplary embodiment of the present invention, wherein the apparatus employs the PEALD method to deposit a TaN thin film.

With reference to the accompanying drawings, the embodiment of the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate, is deposited on another part, it means the part is directly on the other part or above the other part with at least one intermediate part. Further, if any part is said to be deposited directly on another part, it means that there is no intermediate part, layer or structure between the two parts.

Now, an embodiment of the present invention will be described in detail with reference to the accompanying drawings.

FIG. 1 is a schematic diagram of apparatus used in manufacturing a semiconductor device according to an exemplary embodiment of the present invention, where the apparatus employs the PEALD method to deposit a TaN thin film.

Referring to FIG. 1, the thin film deposition apparatus includes storage tanks 11, 12, 13, 14, an 16 for storing process gases, mass flow controllers (MFCs) 21, 22, 23, 24, and 25, valves 30a and 30b for controlling the process gas(ses) flowing from the storage tank, a reactor 1 for reacting the process gases controlled by the MFCs and valves (e.g., to deposit a film onto a substrate in the reactor), gas lines 17 in which these process gases flow, and purge gas lines 18 for purging the reactor 1 and the gas line 17, using the vacuum pump 9 before or after a reaction.

In this case, the reactor 1 includes a shower head 4 for providing uniform flow 5 of the process gas (or gas mixture), and a susceptor 2 for supporting a substrate 3 therein. Also, the reactor 1 is coupled with an RF power supplying apparatus 8 for supplying a power. The RF power supplying apparatus 8 is also coupled with an RF matching box 7 for controlling a periodic supply of power. Accordingly, the plasma reaction can be synchronized to the gas flow 5.

In a plasma-enhanced atomic layer deposition (PEALD) method using this apparatus, first, the reactor 1 may form an oxide layer with a thickness of about 1,000 Å on the silicon substrate 3. Silicon substrate 3 may have a diameter of 200 mm, 300 mm, etc.

In addition, the storage tank 16 supplies a Ta precursor (e.g., pentakis(ethylmethylamino)tantalum, or PEMAT) through the gas line 17 to the reactor 1. The Ta precursor (e.g., pentakis(ethylmethylamino)tantalum) is a metal-organic precursor, and it may react with other processing gases introduced into the reactor 1 or to be deposited on the oxide layer. In this case, a TaN thin film may be formed on the upper surface of the oxide layer. Alternatively, the TA precursor may comprise any organometallic Ta compound having alkylimido and/or dialkylamido groups bound thereto (e.g., of the formula $Ta(NR_2)_x(=NR)_y$, where R is an alkyl group having 6 or fewer (preferably 4 or fewer) carbon atoms and $x+2y=5$, y generally being 0 or 1), such as tertbutylimido(trisdiethylamide)tantalum (TBTDET), pentakis(diethylamide)tantalum (PDEAT), pentakis(dimethylamide)tantalum (PDMAT), etc.

When depositing the TaN thin film using a Ta precursor such as PEMAT, the temperature is generally controlled in a range of from 200° C. to 350° C. (preferably from 250° C. to 350° C.). In addition, impurities may be removed from the TaN thin film by plasma-processing the same using a hydrogen source such as hydrogen gas, or a mixture of a hydrogen source and a nitrogen source such as a mixed gas of hydrogen and nitrogen, to reduce the resistivity and to increase the density of the thin film. Alternatively, the hydrogen and/or nitrogen source may comprise a substantially carbon- and oxygen-free compound such as ammonia ($NH_3$) or hydrazine ($H_2NNH_2$). In addition, the hydrogen and/or nitrogen source may further include an inert gas, such as He or Ar, etc.

The RF power supplying apparatus 7 is operated under a plasma power of 300 W and a frequency of 13.56 MHz to generate plasma. That is, depositing a TaN thin film using PEALD according to the invention includes introducing a Ta precursor (e.g., PEMAT) and forming a TaN thin film by plasma processing. PEALD generally includes a plurality of cycles, wherein each cycle includes (1) purging of the reactor and the gas line, (2) supplying a Ta precursor and depositing a Ta-containing layer on the substrate, (3) purging the reactor and the gas line, (4) introducing a hydrogen and/or nitrogen source into the reactor (e.g., opening the gas valves for $H_2$ and $N_2$), (5) supplying a plasma power to the reactor and performing plasma processing, and (6) stopping the plasma power and closing the gas valves. In one case, the purging and Ta precursor supplying steps are performed for 2 seconds, and the plasma processing is performed for 12 seconds.

Now, the invention will be described in greater detail with reference to FIGS. 2 to 8, in which the TaN thin film deposited from a dialkylamidotantalum (PEMAT) precursor at a temperature higher than 250° C. by the PEALD method has excellent resistivity, thin film component, binding energy, and step coverage characteristics.

First, basic bonding properties of a TaN thin film are analyzed using an X-ray photoelectron spectroscopy (XPS) method. In this case, chemical components of the TaN thin films and the bonding property thereof are analyzed according to deposition temperatures of a thermal decomposition ALD method.

Figure 2:
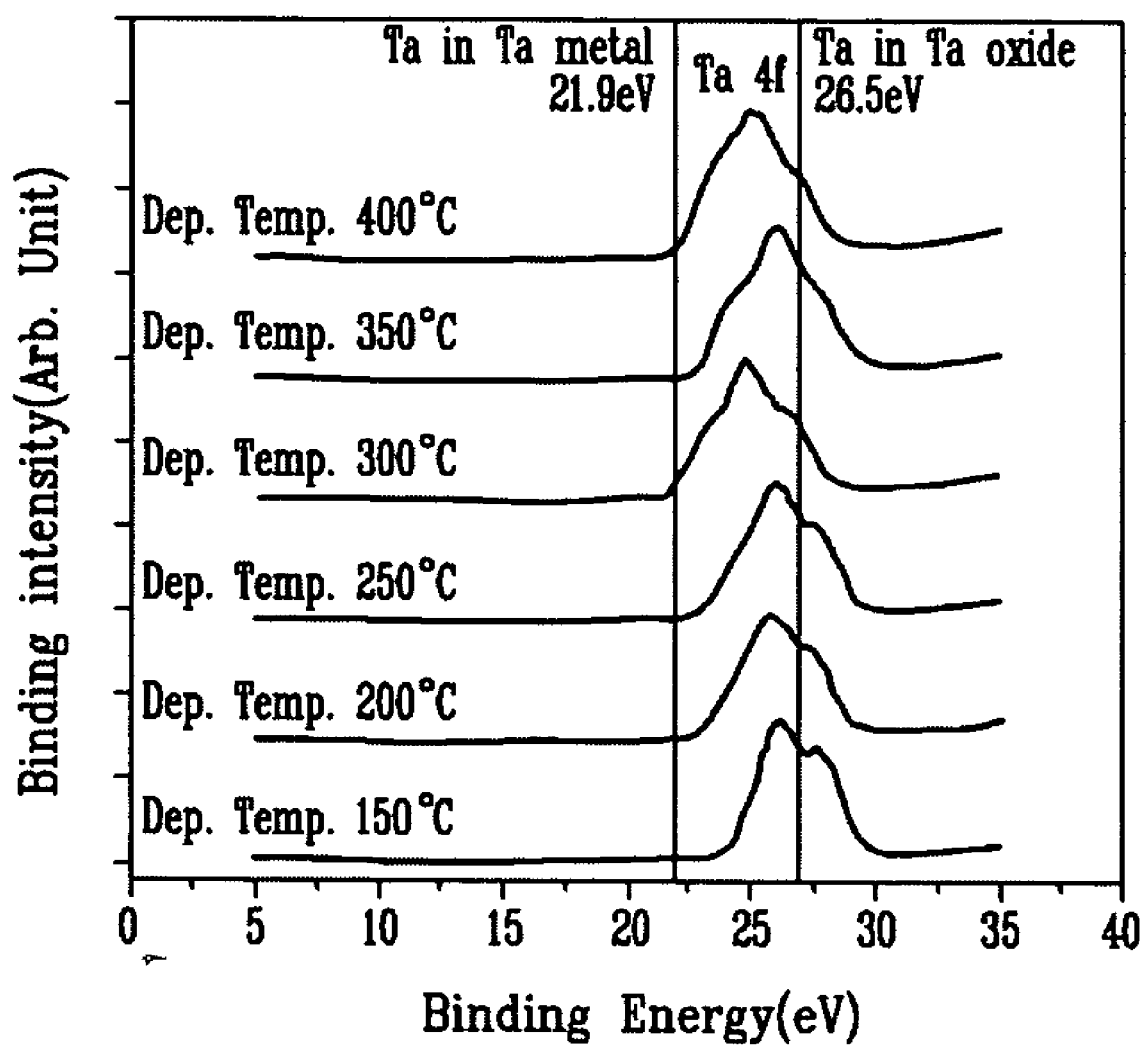
FIG. 2 is a depth profile of TaN thin films deposited by a thermal decomposition ALD method, obtained by XPS-analyzing with respect to various deposition temperatures.

FIG. 2 is a depth profile of TaN thin films deposited by a thermal decomposition ALD method, obtained by XPS-analysis with respect to various deposition temperatures. Generally, it is known that a TaN thin film has a binding energy of 21.5 eV and 26.5 eV. It is also known that peaks appear at 21.9 eV for pure Ta (Ta 4f7/2), and at about 26.5 eV for tantalum oxide.

As shown in FIG. 2, according to the ALD method, peaks of the TaN thin film are stably observed at a similar range of binding energy. In addition, as the deposition temperature is increased, tantalum (Ta) is combined with nitrogen instead of oxygen. That is, according to the thermal decomposition ALD method, the binding property of the TaN thin film shows that Ta binds with oxygen at a deposition temperature of lower than 200° C., and with nitrogen at a deposition temperature of higher than 250° C. Therefore, the deposition processing generally should be performed at a temperature higher than 250° C. in order to obtain a stable TaN thin film.

Now, impurities and compositions of Ta and N in the TaN thin film are analyzed using an Auger electron spectroscopy (AES) method. In this case, they are analyzed according to the deposition temperatures and plasma gases. That is, a variation of binding property with respect to the deposition temperature in the TaN thin film may be observed by the AES analyzing results.

Figure 3:
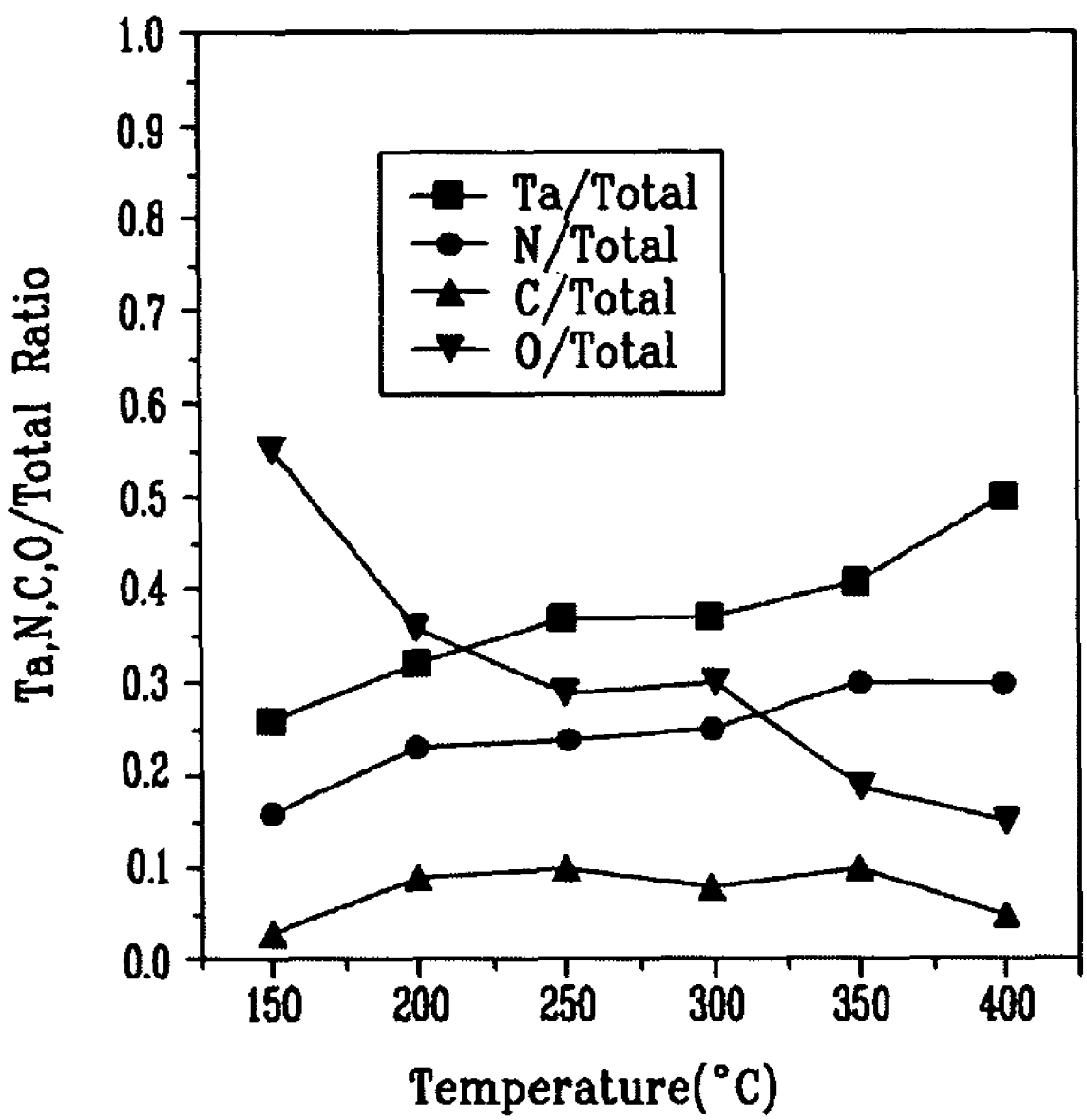
FIG. 3 illustrates results obtained in TaN thin films deposited by the thermal decomposition ALD method, in which certain gas component ratios are varied and in which the results are obtained by an AES analysis, assuming a total of component ratios to be 100.

FIG. 3 illustrates a variation of component ratio of TaN thin films deposited by the thermal decomposition ALD method, which is obtained by an AES analysis assuming a total of component ratios to be 100. As shown in FIG. 3, regarding the composition, as the deposition temperature is increased, the oxygen content is decreased, and the Ta content and the nitrogen content are increased. This result is in concordance with the XPS analysis result of FIG. 2. That is, at a deposition temperature of 250° C. or higher, Ta and nitrogen are combined to generate the TaN thin film (although, under certain conditions, the TaN thin film may have sufficient conductivity properties for some applications when formed at a temperature between 200° C. and 250° C.).

Figure 4:
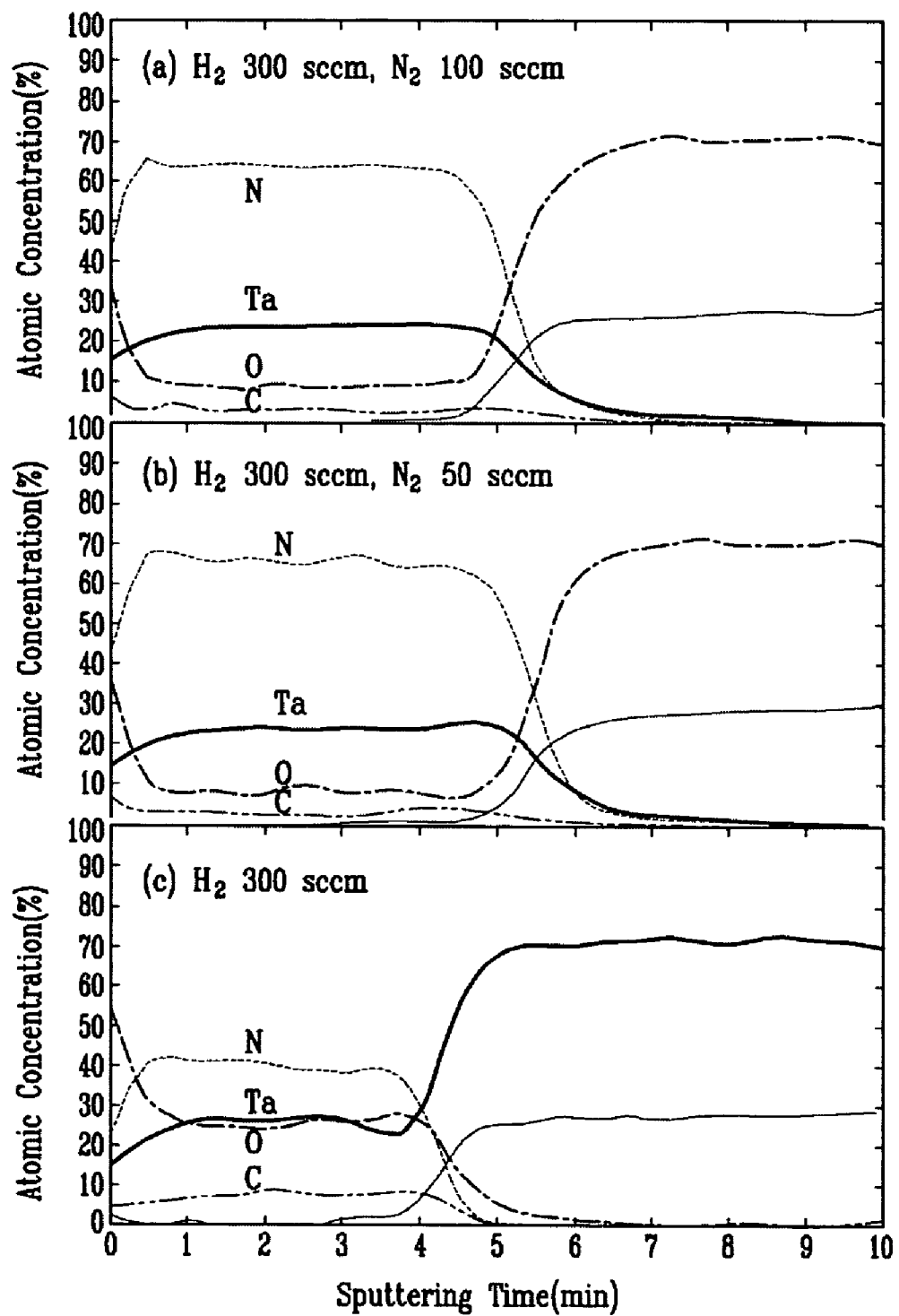
FIG. 4 illustrates a chemical composition analysis result for various kinds of plasma gases used in plasma processing performed for increasing density, decreasing resistivity and/or removing impurities in the TaN thin film deposited using PEMAT.

FIG. 4 illustrates a chemical composition analysis result for various kinds of plasma gases and gas mixtures used in plasma processing the substrate having a Ta-containing layer thereon. Such plasma processing is generally performed for increasing film density and decreasing film resistivity by removing impurities in the TaN thin film deposited using a dialkylamidotantalum precursor such as PEMAT.

In FIG. 4, the TaN thin film is deposited at a deposition temperature of 300° C. over 300 cycles according to the PEALD method. According to scanning electron microscopy (SEM) analysis, the TaN thin film has a thickness of about 0.8 A during each cycle, regardless of the particular plasma gas mixture.

When the plasma gas comprises a mixture of hydrogen and nitrogen sources (e.g., a mixed gas of $H_2$ and $N_2$), the TaN thin film contains impurities of oxygen and carbon at an atomic percentage of 10% or less each (carbon being <<10 at. %), and the nitrogen is at a relatively higher level. This is because, in the plasma processing, carbon is replaced by nitrogen to increase the nitrogen content, the replaced carbon bonds with hydrogen to form volatile hydrocarbons (and/or alkylamines) that are easily removed, and the oxygen impurity can be removed as $H_2O$.

On the other hand, when only $H_2$ gas is used as the plasma gas, the TaN thin film has oxygen impurities at a level of about 25 at. % and carbon impurities at about a 10 at. % level, both of which are relatively higher in comparison with the case of the mixed hydrogen and nitrogen source gasses, and nitrogen is present in an atomic percentage of about 40%. Therefore, it is understood that the impurities are more effectively removed from the TaN thin film when plasma processing is performed using source(s) of hydrogen and nitrogen (e.g., the mixed gas of $H_2$ and $N_2$).

Figure 5:
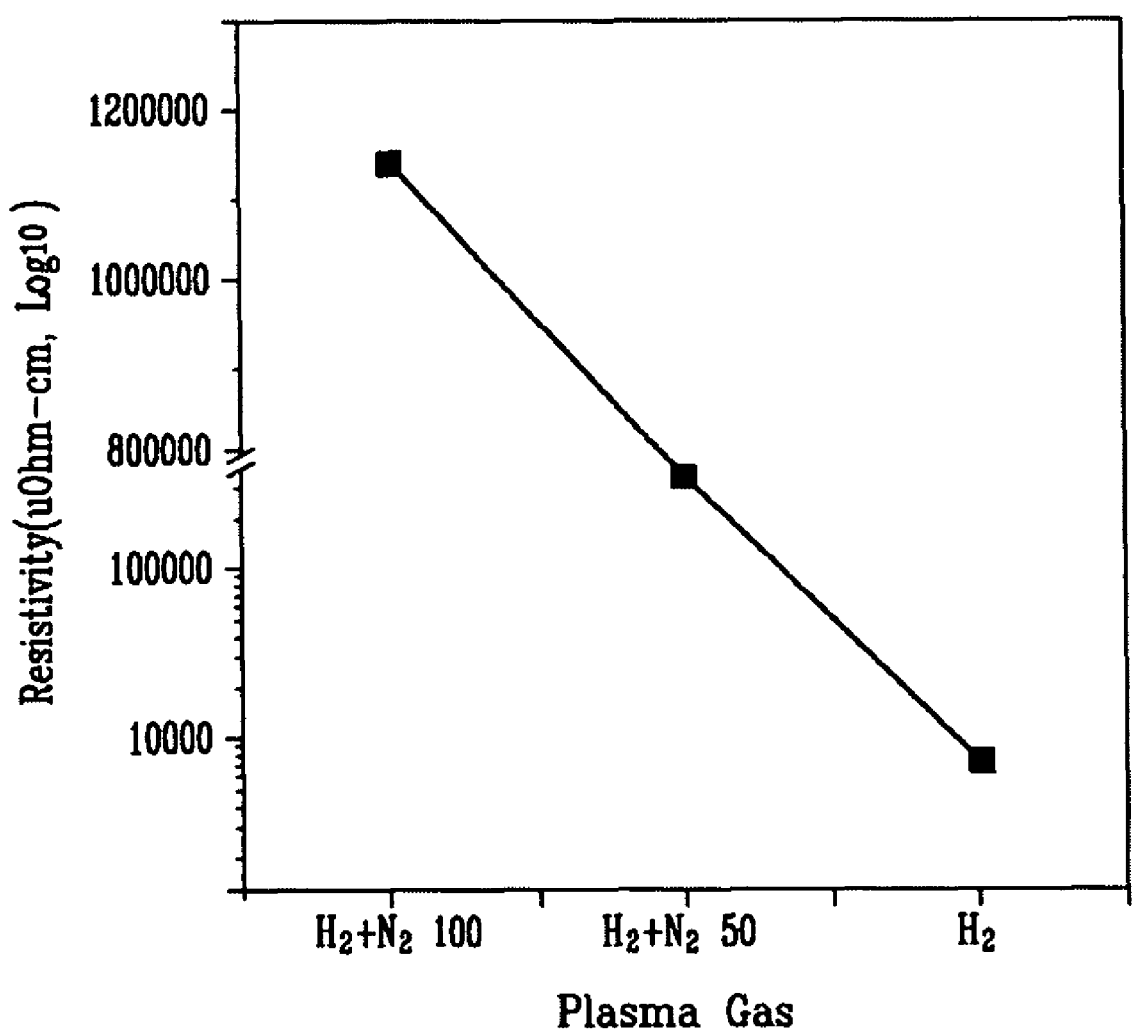
FIG. 5 illustrates a variation of resistivity values of TaN thin films deposited using various plasma gases.

FIG. 5 illustrates a variation of resistivity values of TaN thin films deposited using various plasma gases. Resistivity in the TaN thin film is measured using a 4 point probe method.

As shown in FIG. 5, when only hydrogen is used as the plasma gas, the TaN thin film has impurities of oxygen and carbon at relatively higher levels in comparison with using a mixed gas of $H_2$ and $N_2$. However, the resistivity is considerably reduced to 7,000Ω-cm. This is because the TaN phase generally changes according to the nitrogen content. In more detail, when the mixed gas of $H_2$ and $N_2$ is used as the plasma gas, nitrogen can be replaced with carbon to form an fcc-TaN phase, having a face-center edcubic structure.

The fcc-TaN phase has a crystalline structure by which a resistivity may become more than 10,000Ω-cm. When only hydrogen is used as the plasma gas, the TaN thin film has about 40% nitrogen to form an hcp-$Ta_2N$ phase, that is, a $Ta_2N$ phase of a hexagonal close-packed lattice structure.

According to the PVD method, the hcp-$Ta_2N$ has resistivity of about 300Ω-cm. Accordingly, it is understood that, when only hydrogen is used as the plasma gas according to an exemplary embodiment of the present invention, the hcp-$Ta_2N$ may have a higher resistivity than that of a conventional hcp-$Ta_2N$. This is because impurities such as oxygen may be present.

Figure 6:
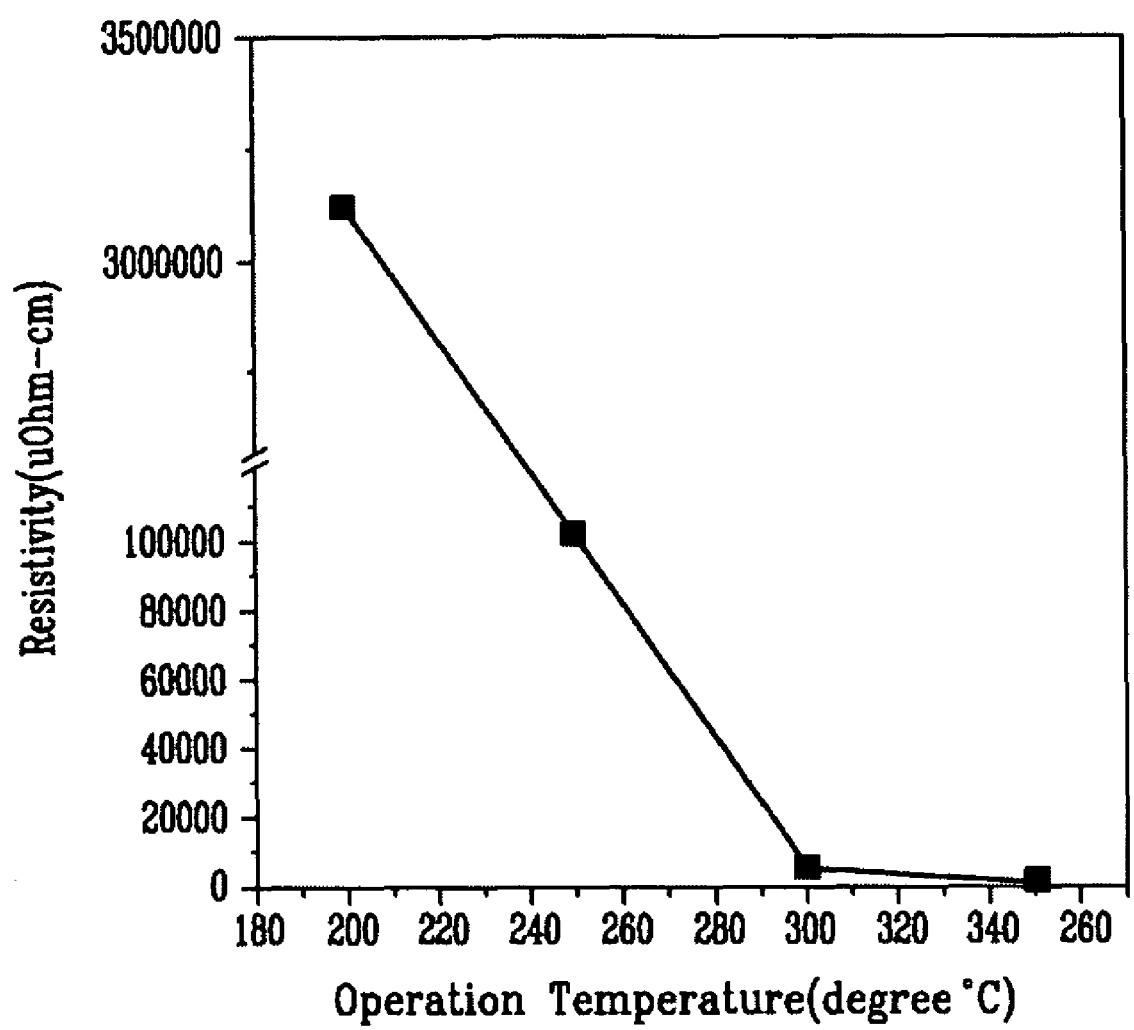
FIG. 6 illustrates a variation of resistivity values depending on deposition temperatures with respect to a TaN thin film having a 320 Å thickness after 400 cycles of plasma processing when $H_2$ is used as a plasma gas.

FIG. 6 illustrates a variation of resistivity values depending on deposition temperatures with respect to a TaN thin film having a 320 Å thickness after 400 cycles of plasma processes when $H_2$ is used as a plasma gas. As shown in FIG. 6, the resistivity varies significantly according to the deposition temperature. The TaN thin film has a low resistivity of 960Ω-cm when deposited at a temperature of about 350° C.

Figure 7:
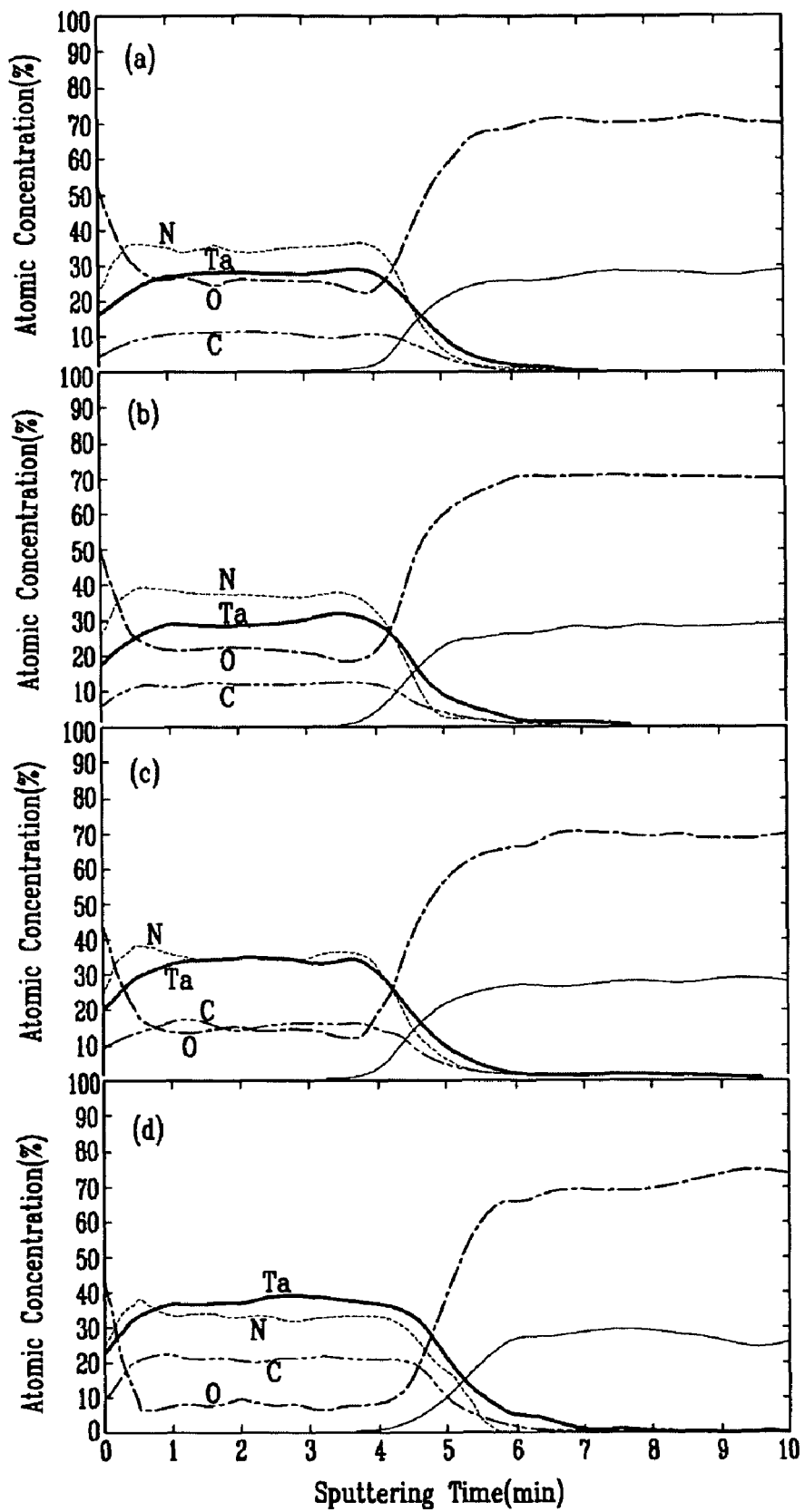
FIG. 7 illustrates a composition analysis result of TaN thin films formed at various deposition temperatures using a plasma gas containing $H_2$, obtained by an AES analysis.

FIG. 7 shows composition analyses (obtained by AES analysis) of TaN thin films formed at various deposition and/or processing temperatures using an $H_2$ plasma gas. As shown in FIG. 7, when the TaN thin film is processed under an $H_2$ gas plasma atmosphere, the TaN thin film has a relatively uniform nitrogen content (in a range of from 30% to about 40%), regardless of the deposition temperature. However, the TaN thin film has a relatively smaller oxygen content as the deposition temperature is increased (from (a) to (d)), and Ta and carbon contents become larger as the oxygen content becomes smaller.

From FIG. 6 and FIG. 7, it is understood that the resistivity increase primarily depends on the oxygen content rather than the carbon content in the TaN thin film. In addition, when $H_2$ is used as a plasma gas, the nitrogen content may be constant regardless of the deposition temperature. Thus, the TaN phase may also be constant regardless of the deposition temperature.

Figure 8:
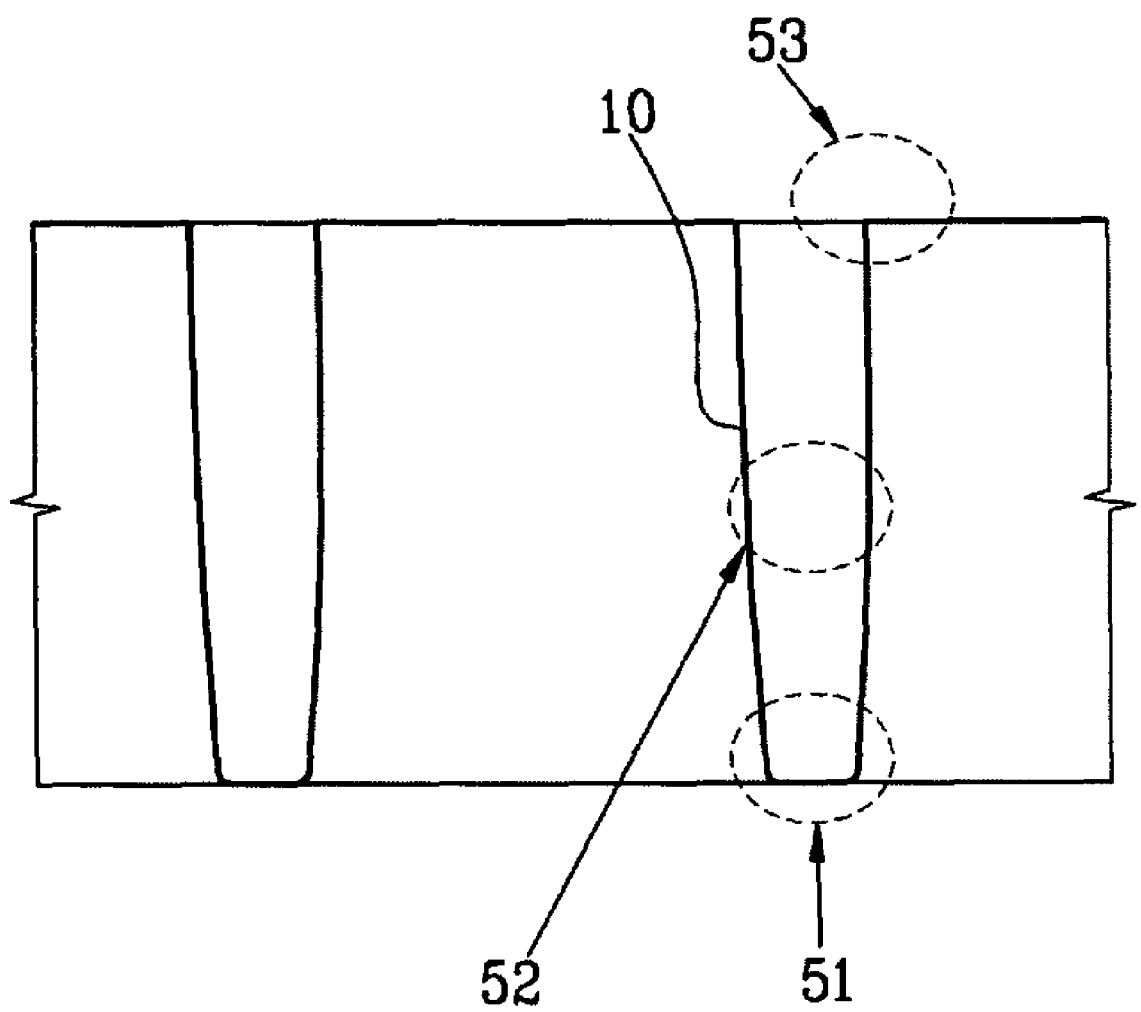
FIG. 8 illustrates step coverage of a TaN thin film deposited on a substrate containing a single pattern having a via hole with an opening width of 0.18 μm and an aspect ratio of 6:1, at a deposition temperature of 300° C., and by 200 cycles of plasma processing using an $H_2$ plasma gas, which is obtained by SEM analysis.

FIG. 8 illustrates step coverage of a TaN thin film deposited on a substrate having a single pattern thereon (e.g., a via hole pattern having an opening width of 0.18 μm and an aspect ratio of 6:1), at a deposition temperature of 300° C., using 200 cycles of plasma processing and an $H_2$ plasma gas. The results in FIG. 8 were obtained by SEM analysis.

As shown in FIG. 8, the TaN thin film 10 has side coverage at locations 52 and 53 in the via hole of about 95% and bottom coverage at location 51 of about 80%. The TaN thin film has excellent step coverage.

From the above description, the resistivity, composition, binding property and step coverage characteristics of the TaN thin film to be used as a diffusion barrier for a copper line with a width of 65 nm or less in a semiconductor device is found to be as described below.

From the XPS and AES analysis result, the TaN thin film deposited by the thermal decomposition ALD method is found to have a stronger Ta-N binding strength as the deposition temperature is increased. However, according to the PEALD method, when the plasma gas contains hydrogen and no nitrogen source, the TaN thin film has a much better resistivity characteristic than in the case where the plasma gas comprises $H_2$ and $N_2$. That is, the TaN thin film has a low resistivity of 960Ω-cm when deposited at 350° C. under an $H_2$ gas plasma atmosphere. The resistivity is mostly dependent on the oxygen content among the impurities.

According to the PEALD method, the TaN thin film has excellent step coverage of about 95% in the via-hole structure of a size of 0.18 μm and an aspect ratio of 6:1. Meanwhile, the TaN thin film may be used as diffusion barrier such that a metal line may be formed on the TaN thin film. These metal lines may comprise copper, aluminum, or tungsten.

Now, a method for forming a copper line according to an exemplary embodiment of the present invention will be described below.

A TaN thin film is formed as described above, and a seed copper layer may be deposited on the TaN thin film by a conventional technique (e.g., electroplating). Copper lines are then formed on the seed copper layer by a conventional technique (e.g., PVD).

In addition, Ta may be deposited on the TaN thin film, prior to depositing a seed copper layer on the Ta. The copper line may then be formed on the seed copper layer by PVD, ALD, or CVD.

In addition, the copper line may be formed in a dual damascene and/or a single damascene pattern. In other words, the substrate may have an upper (or exposed) insulator layer containing a predetermined dual damascene and/or a single damascene pattern therein. In such a case, the TaN thin film may provide a diffusion barrier function for the copper line of any pattern in the single and dual damascene patterns.

According to an exemplary embodiment of the present invention, the method of manufacturing a semiconductor device generally employs a PEALD method, using an organometallic Ta precursor such as PEMAT to form a TaN thin film. As a result, a conformal TaN diffusion barrier may be formed at a temperature higher than 250° C. so that impurities are reduced and density is increased in the TaN thin film.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a semiconductor device, comprising:
    forming a TaN thin film from a Ta precursor comprising pentakis ethylmethylamino tantalum (PEMAT), tertbutylimido tris-dimethylamide tantalum (TBTDET), pentakis diethylamide tantalum (PDEAT), or pentakis dimethylamide tantalum (PDMAT) by plasma-enhanced atomic layer deposition (PEALD) using a plasma gas comprising hydrogen ($H_2$) and nitrogen ($N_2$) at a temperature of 400° C. or higher on a substrate having a plurality of predetermined structures therein and/or thereon, wherein the TaN thin film contains not more than 10% of carbon impurities;
    depositing a seed copper layer on the TaN thin film; and
    forming a copper line on the seed copper layer.

2. The method of claim 1, wherein the seed copper layer is formed by a Physical Vapor deposition (PVD) method.

3. The method of claim 1, wherein depositing the seed copper layer comprises a PVD method, an ALD method, or a CVD method.

4. The method of claim 1, wherein the semiconductor device is on or in a substrate and/or a dual damascene pattern and/or a single damascene pattern.

5. The method of claim 1, wherein the Ta precursor comprises PEMAT.

6. The method of claim 1, wherein the Ta precursor comprises PDEAT.

7. The method of claim 1, wherein the Ta precursor comprises PDMAT.

8. The method of claim 1, wherein the Ta precursor comprises TBTDET.

9. The method of claim 1, wherein the plasma gas is carbon-free and oxygen-free.

10. The method of claim 1, wherein the TaN thin film contains not more than 10% of oxygen impurities.

11. The method of claim 1, wherein forming the TaN thin film comprises depositing the TaN thin film into a via hole pattern, the via hole having an opening width of about 0.18 μm.

12. The method of claim 11, wherein forming the TaN thin film comprises depositing the TaN thin film into a via hole pattern, the via hole having an aspect ratio of about 6:1.

13. The method of claim 12, wherein forming the TaN thin film comprises depositing the TaN thin film using about 200 cycles of plasma processing.

14. The method of claim 1, wherein forming the TaN thin film comprises depositing the TaN thin film into a via hole pattern, the via hole having an aspect ratio of about 6:1.

15. The method of claim 1, wherein forming the TaN thin film comprises depositing the TaN thin film using about 200 cycles of plasma processing.

16. The method of claim 1, wherein the method further comprises:
    depositing tantalum on the TaN thin film; and
    depositing the seed copper layer on the tantalum.

17. The method of claim 16, wherein the copper line is formed on the seed copper layer by PVD, ALD, or CVD.

18. The method of claim 1, wherein the copper line is formed on the seed copper layer by PVD, ALD, or CVD.

* * * * *